(12) United States Patent
Li

(10) Patent No.: US 7,754,987 B2
(45) Date of Patent: Jul. 13, 2010

(54) SWITCH FOR ELECTRONIC DEVICE

(75) Inventor: Chia-Pin Li, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 201 days.

(21) Appl. No.: 12/166,336

(22) Filed: Jul. 2, 2008

(65) Prior Publication Data

US 2009/0237911 A1    Sep. 24, 2009

(30) Foreign Application Priority Data

Mar. 21, 2008    (CN) .................... 2008 1 0300650

(51) Int. Cl.
*H01H 9/00* (2006.01)
*G01D 11/28* (2006.01)

(52) U.S. Cl. ............... 200/313; 200/316; 200/317; 362/23; 362/29

(58) Field of Classification Search ........... 362/23, 362/26, 29; 200/5 E, 5 R, 310, 313, 316, 200/317

See application file for complete search history.

(56) References Cited

U.S. PATENT DOCUMENTS 6,948,824 B2 *   9/2005   Miwa ...................... 362/26
7,381,128 B2 *   6/2008   Ogawa et al. ............. 454/69

* cited by examiner

*Primary Examiner*—John A Ward
(74) *Attorney, Agent, or Firm*—Zhigang Ma

(57) ABSTRACT

A switch includes a substrate including a main body and a cylindrical portion protruding upright from the main body and defining a transverse groove in the outer surface thereof, a light emitter fixed on the cylindrical portion to receive light beams from the light emitter and produce three electrical outputs respectively, and a dial member including a cylindrical dial and two arms protruding upright from the cylindrical dial and forming two engagement portions on the inner surfaces thereof respectively. The engagement portions are engaged in the groove so that the cylindrical dial is rotatable to a number of orientations in which the produced electrical outputs are coded into a number of different switch signals by selectively blocking the radiated light beams using the two arms.

8 Claims, 4 Drawing Sheets

| Central button | Dial indicator | Pushed sector button | 132 | 134 | 136 | Function |
|---|---|---|---|---|---|---|
| — | F1 | — | 1 | 0 | 0 | F1 |
| — | F2 | — | 0 | 1 | 0 | F2 |
| — | F3 | — | 0 | 0 | 1 | F3 |
| — | SA | 162 | 0 | 1 | 1 | F4 |
| — | SA | 164 | 1 | 0 | 1 | F5 |
| — | SA | 166 | 1 | 1 | 0 | F6 |
| Pushed | — | — | 0 | 0 | 0 | F7 |
| — | — | — | 1 | 1 | 1 | — |

SWITCH FOR ELECTRONIC DEVICE

BACKGROUND

1. Technical Field

The present invention relates to switches, and particularly, to a switch for an electronic device.

2. Description of the Related Art

Generally, switches for controlling some aspect of electronic devices are push-buttons. Such a switch typically includes a metal bridge, which, when the switch is pushed down, can link two metal terminals so as to trigger a corresponding function of an electronic device. A problem of utilizing the switch in the electronic device is that circuits of the electronic device may be shorted by metal scraps scratched from the metal bridge and the terminals, when the metal bridge is biased against the metal terminals.

Therefore, it is desirable to provide a switch for an electronic device, which can overcome the above-mentioned problem.

SUMMARY

In a present embodiment, a switch includes a substrate, a light emitter, three photoelectric members, and a dial member. The substrate includes a main body, and a cylindrical portion. The cylindrical portion protrudes upright from the main body, and defines a transverse groove in the outer surface thereof. The light emitter is fixed on the cylindrical portion, and configured for radiating three light beams. The three photoelectric members are fixed on the main body, and surround the cylindrical portion to receive the radiated light beams and produce three electrical outputs respectively. The dial member includes a cylindrical dial and two arms. The two arms protrude upright from the cylindrical dial and form two engagement portions on the inner surfaces thereof respectively. The engagement portions are engaged in the groove so that the cylindrical dial is rotatable to a number of orientations in which the produced electrical outputs are coded into a number of different switch signals by selectively blocking the radiated light beams using the two arms.

BRIEF DESCRIPTION OF THE DRAWING

Many aspects of the present switch should be better understood with reference to the following drawings. The components in the drawings are not necessarily drawn to scale, the emphasis instead being placed upon clearly illustrating the principles of the present switch. Moreover, in the drawings, like reference numerals designate corresponding parts throughout the several views.

FIG. 4 is a truth table of the switch, according to the exemplary embodiment of FIG. 1.

DETAILED DESCRIPTION

Figure 1:
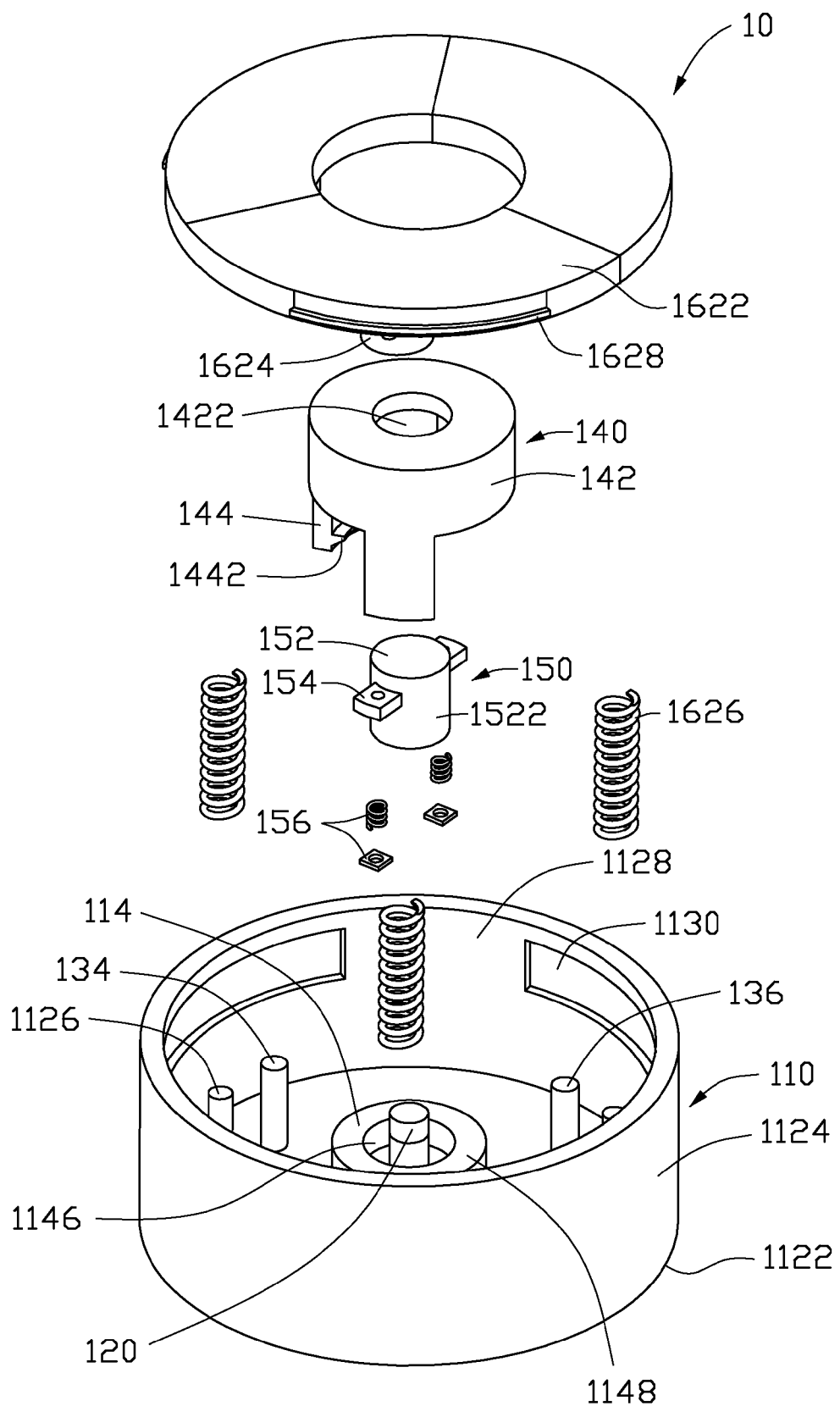
FIG. 1 is an isometric, exploded view of a switch, according to an exemplary embodiment.
Figure 2:
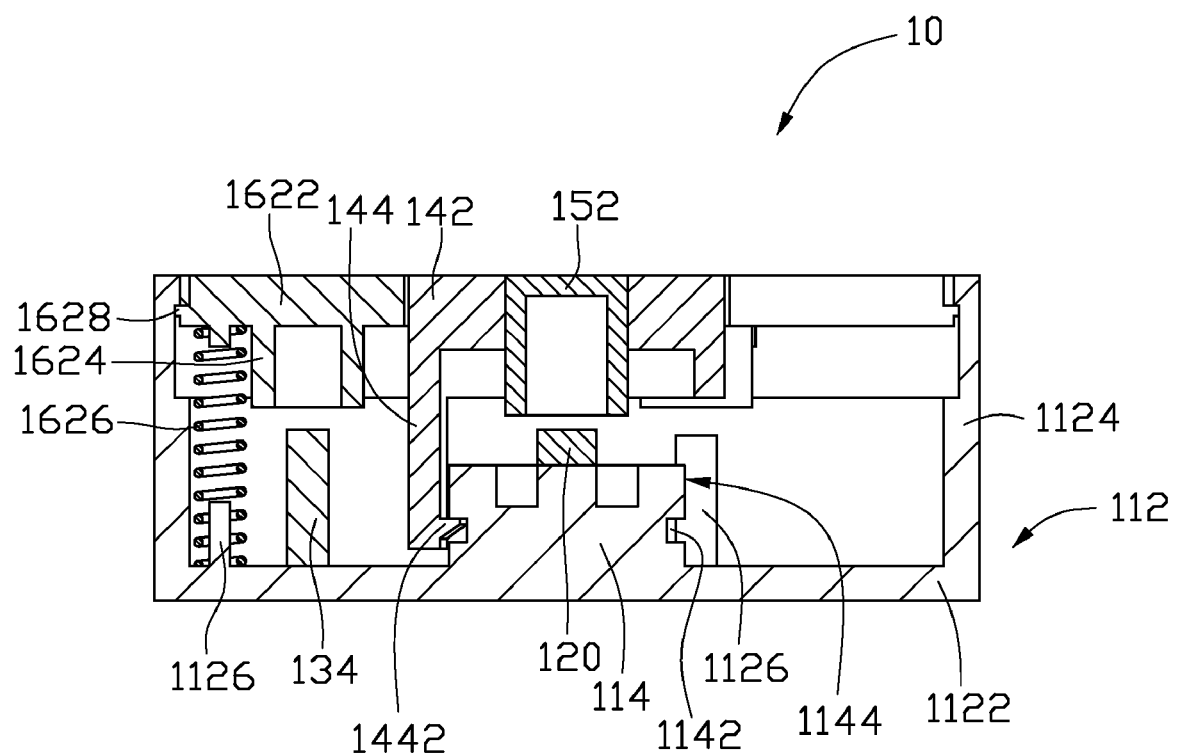
FIG. 2 is a cross-sectional, assembled view of a switch, according to the exemplary embodiment of FIG. 1, taken along a line across the axis of the switch.
Figure 3:
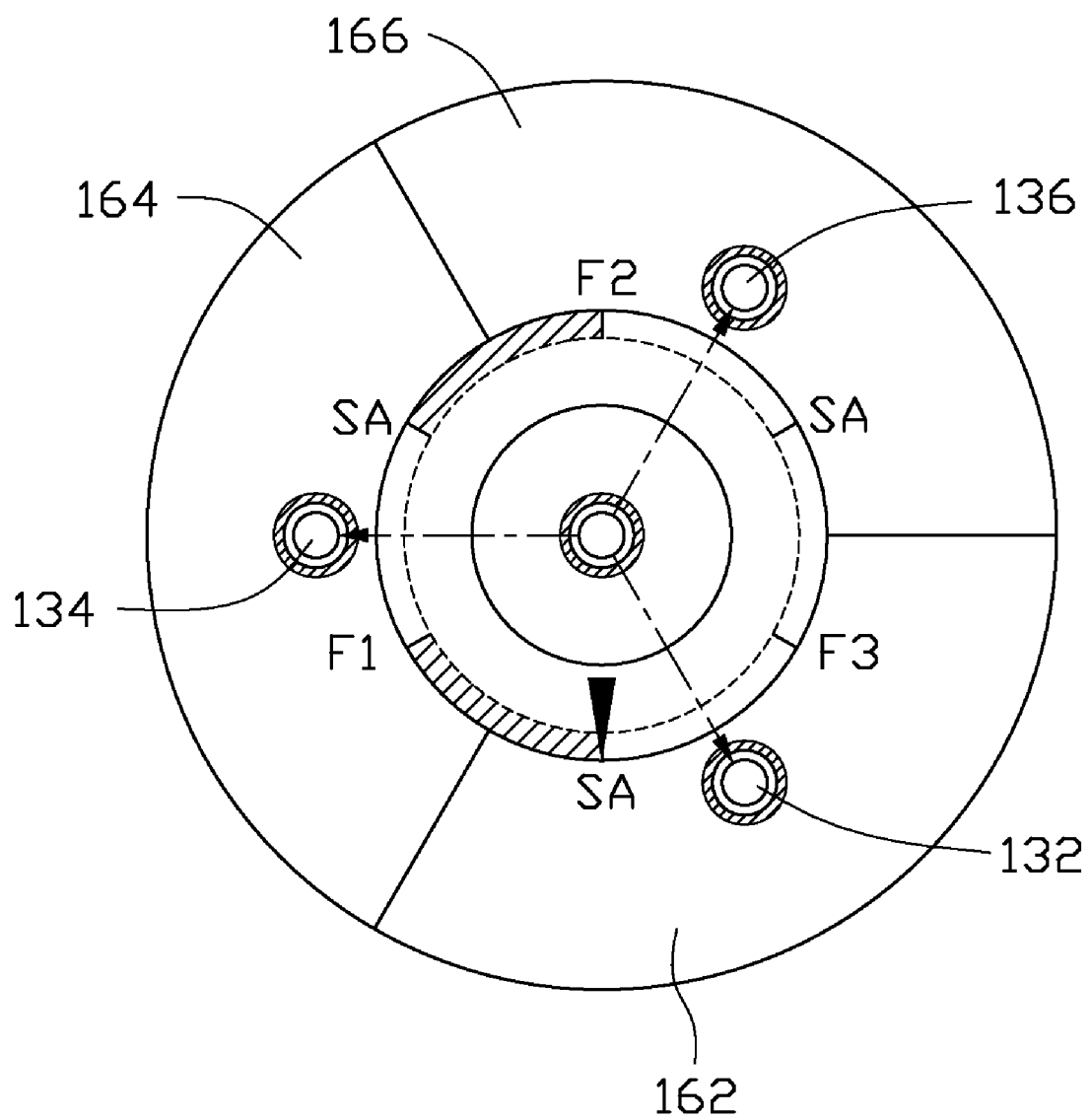
FIG. 3 is a planar, schematic view of the switch, according to the exemplary embodiment of FIG. 1.

Referring to FIGS. 1 through 3, a switch 10 for an electronic device (not shown) includes a substrate 110, a light emitter 120, three photoelectric members 132, 134, and 136, and a dial member 140. The substrate 110 includes a main body 112, and a cylindrical portion 114. The cylindrical portion 114 protrudes upright from the main body 1112, and defines a transverse groove 1142 in the outer surface 1144 thereof. The light emitter 120 is fixed on the cylindrical portion 114, and configured for radiating three light beams. The three photoelectric members 132, 134, and 136 are fixed on the main body 112, and surround the cylindrical portion 114 to receive the radiated light beams and produce three electrical outputs respectively. The dial member 140 includes a cylindrical dial 142, and two arms 144. The two arms 144 protrude upright from the cylindrical dial 142 and form two engagement portions 1442 on the inner surfaces thereof respectively. The engagement portions 1442 are engaged in the transverse groove 1142 such that the cylindrical dial 142 is rotatable to six orientations at which the three produced electrical outputs are coded into four different switch signals by selectively blocking the radiated light beams using the two arms 144.

The main body 112 includes a disk-shaped base 1122, and a sidewall 1124. The sidewall 1124 extends up from the perimeter of the disk-shaped base 1122, and is configured for packing the switch 10. The cylindrical portion 114 is positioned on the center of the disk-shaped base 1122.

In this embodiment, the light emitter 120 is an infrared (IR) light emitter, and emits three IR light beams in a plane parallel to the disk-shaped base 1122 and each adjacent two having an included angle of 120 degrees. Accordingly, the photoelectric members 132, 134, and 136 are IR sensors, and are positioned on the disk-shaped base 1122 with their sensing portion in the plane of the IR light beams so as to efficiently receive the IR light beams.

Understandably, the light emitter and photoelectric members are not limited by this embodiment, and can also be other types of light emitter and light sensors. It also should be understood that the number of the radiated light beams and the photoelectric members is not limited to three, but can be set depending on requirement. Also, the light beams and the photoelectric members can be set asymmetrically about the light emitter to meet specific requirements.

The cylindrical dial 142 has a diameter a little greater than that of the cylindrical portion 144. The perimeter of one end of the cylindrical dial 142 is divided into six equal arcs. The two arms 144 are aligned with two of the six arcs respectively with at least one arc interposed therebetween. The six arcs represent six orientations, i.e. three "SA"s, a "F1", a "F2", and a "F3". Also referring to FIG. 4, when the cylindrical dial 142 is thumbed to any of the six orientations, indicated by an indicator (the black arrow in FIG. 3), the three electrical outputs of the three photoelectric members 132, 134, and 136 are coded as four switch signals '111', '001', '100', and '010' respectively (see FIG. 4), wherein '0' represents gathered electric charges of a corresponding photoelectric member are less than a predetermined amount, '1' represents that gathered electric charges of a corresponding photoelectric member exceed the predetermined amount. Then the switch signals '001', '100', and '010' can be assigned to trigger three functions of the electronic device respectively such as three operation modes of the electronic device.

It should be understood that the configuration of the arms (number, shape and positions) also can be selectively set to meet differing requirements.

Referring back to FIG. 1, the cylindrical portion 114 defines an annular longitudinal groove 1146 on the top surface 1148 thereof, surrounding the light emitter 120. The cylindrical dial 142 defines a central hole 1422 therein, facing the annular longitudinal groove 1146. The switch 10 further includes a hollow central button 150. The central button 150 includes a cap 152, two wings 154, and two first restoration elastic members 156. The cap 152 is shaped so as to be fittingly received in the central hole 1422, and can be matingly inserted into the annular longitudinal groove 1146. Thereby, when the cap 152 is pushed down, the light emitter 120, which is centered on the annular longitudinal groove 1146, is totally covered by the cap 152. The three light beams are all blocked, and therefore the three electrical outputs in this case are coded as a switch signal '000' (see FIG. 4), which can be assigned to trigger a function of the electronic device such as recording video (assuming the electronic device is a camera). The two wings 154 are formed on the outer side-wall 1522 of the cap 152. The two first restoration elastic members 156 may be two springs, and are fixed to the wings 154 respectively and interposed between the wings 154 and the cylindrical portion 114 so as to restore the cap 152 to its normal position when the cap 152 is released.

Understandably, the number of the wings and the first restoration elastic members are not limited to two, and can be more to enhance the restoration effect. The first restoration elastic members are not limited to being springs, but can other parts having similar function.

Specifically, the switch 10 of this embodiment also includes three sector buttons 162, 164, and 166, which have essentially similar structures. The sector button 162 is exemplarily described to give a better understanding of the sector buttons 162, 164, and 166.

The sector button 162 may include a sector-shaped pressing plate 1622, a cap receiving-portion 1624, and a second restoration elastic member 1626. The cap receiving-portion 1624 is formed on the sector-shaped pressing plate 1622. The sector-shaped pressing plate 1622 is placed above a corresponding photoelectric member, e.g., the photoelectric member 132, so that the cap receiving-portion 1624 faces the corresponding photoelectric member 132, and is supported by the second restoration elastic member 1626 such as a spring which is interposed between the sector-shaped pressing plate 1622 and the disk-shaped base 1122. Being so structured, when the sector-shaped pressing plate 1622 is pressed, the photoelectric member 132 is totally received by the cap receiving portion 1624. In other words, the three electrical outputs of the photoelectric members 132, 134, and 136 can be coded by selectively pressing one of the sector-shaped pressing plates 1622 to output switch signals '011', '101', '110' (see FIG. 4), which can be assigned to trigger functions of the electronic device such as zoom in/out, taking a photo (assuming the electronic device is a camera). Understandably, the restoration elastic members 1624 are functioned to restore the sector-shaped pressing plates 1622 to their normal positions respectively. In particular, the main body 112 further includes three posts 1126. The posts 1126 protrude upright from the disk-shaped base 1122 and are positioned to locate the second restoration elastic members 1626 respectively.

The sector-shaped pressing plates 1622 may have a central angle of 120 degrees, and are sized so as to seal the substrate 110 when they are assembled to the substrate 110. In particular, the inner surface 1128 of the sidewall 1124 may define three grooves 1130. The three sector-shaped pressing plates 1622 respectively include three guide portions 1628 radially protruding outwards therefrom and being received by the three grooves 1130 respectively so as to limit the movement of the sector-shaped pressing plates 1622.

In more detail, the switch 10 may further include three levers positioned at the three junctions of the sector-shaped pressing plates 1622 respectively to prevent any two or three sector-shaped pressing plates from being pushed down simultaneously.

It will be understood that the above particular embodiments and methods are shown and described by way of illustration only. The principles and the features of the present invention may be employed in various and numerous embodiment thereof without departing from the scope of the invention as claimed. The above-described embodiments illustrate the scope of the invention but do not restrict the scope of the invention.

What is claimed is:

1. A switch for an electronic device, comprising:
a substrate comprising:
a main body; and
a cylindrical portion protruding upright from the main body and defining a transverse groove in the outer surface thereof;
a light emitter fixed on the cylindrical portion and configured for radiating a plurality light beams;
a plurality of photoelectric members fixed on the main body and surrounding the cylindrical portion so as to receive the radiated light beams and produce a plurality of electrical output respectively; and
a dial member comprising:
a cylindrical dial;
a plurality of arms protruding upright from the cylindrical dial and forming a plurality of engagement portions on the inner surfaces thereof respectively, the engagement portion engaging in the transverse groove so that the cylindrical dial is rotatable to a plurality of orientations at which the produced electrical outputs are coded as a plurality of switch signals by selectively blocking the radiated light beams using the arms.

2. The switch as claimed in claim 1, wherein the light emitter comprises an infrared light emitter.

3. The switch as claimed in claim 1, wherein each photoelectric member comprises an infrared light sensor.

4. The switch as claimed in claim 1, wherein the light emitter is configured for emitting three light beams in a plane and each two having an included angle 120 degree, the plurality of photoelectric members are three photoelectric members positioned so as to receive the three light beams and produce three electrical outputs respectively, the perimeter of one end of the cylindrical dial being averagely divided into six arcs, the arms comprising two arms derived upright from two of the six arcs with one arc interposed therebetween.

5. The switch as claimed in claim 4, wherein the plurality of orientations are six orientations, in three of which the three produced electrical outputs are coded as '111', and the others of which the three produced electrical outputs are coded as '100', '010', and '001', wherein the digit '0' represents an corresponding electrical output being smaller a predetermined value, and '1' represents an corresponding electrical output being greater the predetermined value.

6. The switch as claimed in claim 5, wherein the coded electrical outputs '100', '010', and '001' are associated with three corresponding functions of the electronic device.

7. The switch as claimed in claim 1, wherein the cylindrical portion defines an annular longitudinal groove on the top surface thereof and surrounding the light emitter, the cylindrical dial defining a central hole therein facing the annular longitudinal groove, the switch further comprising a central button, the central button comprising a cap, a plurality of wings, and a plurality of restoration elastic members, the cap being shaped so as to be fittingly received in the central hole and be matingly received by the annular longitudinal groove, the wings being formed on cap, the two restoration elastic members being fixed to the wings respectively and interposed between the wings and the cylindrical portion.

8. The claim as claimed in claim 1, further comprising a plurality of sector buttons, each sector button comprising a sector-shaped pressing plate, a cap receiving-portion, and a restoration elastic member, the sector-shaped pressing plate being placed above a corresponding photoelectric member such that the cap receiving-portion faces the corresponding photoelectric member, and supported by the restoration elastic member which is interposed between the sector shaped pressing plate and the main body.

* * * * *